(12) United States Patent
Petropoulos

(10) Patent No.: US 8,406,853 B2
(45) Date of Patent: Mar. 26, 2013

(54) MULTI TRANSMIT/RECEIVE HEAD ARRAY COIL WITH REMOVABLE PANELS

(75) Inventor: Labros Petropoulos, Winnipeg (CA)

(73) Assignee: Imris Inc., Winnipeg, Manitoba (CA)

( * ) Notice: Subject to any disclaimer, the term of this patent is extended or adjusted under 35 U.S.C. 154(b) by 55 days.

(21) Appl. No.: 12/945,454

(22) Filed: Nov. 12, 2010

(65) Prior Publication Data

US 2012/0123245 A1  May 17, 2012

(51) Int. Cl.
*A61B 5/05* (2006.01)

(52) U.S. Cl. ......... 600/417; 600/407; 600/410; 600/422

(58) Field of Classification Search .................. 600/407, 600/410, 417, 422
See application file for complete search history.

(56) References Cited

U.S. PATENT DOCUMENTS

| 6,969,992 | B2 | 11/2005 | Vaughan |
| 6,982,554 | B2 | 1/2006 | Kurpad |
| 7,525,313 | B2 | 4/2009 | Boskamp |
| 7,706,858 | B1 | 4/2010 | Green et al. |
| 2010/0185198 | A1 | 7/2010 | Piferi et al. |

FOREIGN PATENT DOCUMENTS

| WO | WO03098234 | 11/2003 |
| WO | WO2009040677 | 4/2009 |
| WO | WO2009146522 | 12/2009 |

*Primary Examiner* — Unsu Jung
*Assistant Examiner* — Joel Lamprecht
(74) *Attorney, Agent, or Firm* — Adrian D. Battison; Ade & Company Inc.

(57) ABSTRACT

A modular multi-transmit head coil for use in Deep Brain Stimulation procedures includes a mounting frame arranged for attachment to the stereotactic head frame of the patient. An integrated MR stereotactic locating phantom is included as part of the coil structure which has attached MR/CT compatible fiducials on it to correlate pre-op, intra-op and post op images. The frame carries a series of modular removable coil elements in a transceive array that are connected to a set of RF power amplifiers that directly drive the coil elements. A control system including suitable software is arranged to control the signals to the coil elements so as to generate a required RF field with all the coil elements in place and with one or more the coil elements removed to allow access to the patent for the installation of the DBS leads.

20 Claims, 6 Drawing Sheets

MULTI TRANSMIT/RECEIVE HEAD ARRAY COIL WITH REMOVABLE PANELS

This invention relates to a transmit/receive coil array for use in MR Imaging of the head of a patient which is provided with removable panels and is arranged primarily for Deep Brain Stimulation (DBS) but can also be used with other stereotactic procedures including the positioning of needles for biopsies.

BACKGROUND OF THE INVENTION

Deep brain stimulation is a surgical treatment involving the implantation of a medical device called a brain pacemaker, which sends electrical impulses to specific parts of the brain. DBS in select brain regions has provided remarkable therapeutic benefits for otherwise treatment-resistant movement and affective disorders such as chronic pain, Parkinson's disease, tremor and dystonia The deep brain stimulation system consists of three components: the implanted pulse generator (IPG), the lead, and the extension. The IPG is typically a battery-powered neurostimulator encased in a titanium housing, which sends electrical pulses to the brain to interfere with neural activity at the target site. The lead is typically a coiled wire insulated in polyurethane with four platinum iridium electrodes and is placed in one of three areas of the brain. The lead is connected to the IPG by the extension, an insulated wire that runs from the head, down the side of the neck, behind the ear to the IPG, which is placed subcutaneously below the clavicle or in some cases, the abdomen. The IPG can be calibrated by a neurologist, nurse or trained technician to optimize symptom suppression and control side effects.

DBS leads are located in the brain according to the type of symptoms to be addressed. For non-Parkinsonian essential tremor the lead is placed in the ventrointermedial nucleus (VIM) of the thalamus. For dystonia and symptoms associated with Parkinson's disease (rigidity, bradykinesia/akinesia and tremor), the lead may be placed in either the globus pallidus or subthalamic nucleus.

All three components are surgically implanted inside the body. Under local anesthesia, a hole about 14 mm in diameter is drilled in the skull and the electrode is inserted, with feedback from the patient for optimal placement. The installation of the IPG and lead occurs under general anesthesia.

Stereotactic procedures and specifically Deep Brain Stimulation can benefit enormously with the use of Magnetic resonance as a guidance for both more accurate placing the needles for biopsies or guiding and placing the stimulation leads for the DBS procedure. Particularly for DBS procedures, there exists a limitation for the use of magnetic resonance during and after the implantation of the electrodes on the DBS procedure. This arises due to the heating of the leads which will occur in the transmit RF field necessary for MR Imaging. The heating of the leads must be maintained at a temperature less than a specified maximum in order to avoid over heating of tissue and consequential damage.

For a DBS procedure three are in general three stages that Magnetic Resonance can be utilized as a guidance for the procedure. The first step is the placing the stereotactic frame on the patient's head that is bolted on the skull with four pins that are attached to the frame and to the skull of the patient. Then a stereotactic locating phantom is attached to the frame and the patient is ready for pre-operative imaging. The purpose of this phantom is to calibrate for any non-linearities and non-uniformities arising from the main magnetic field as well as the gradient. In addition, it provides additional information regarding image intensity correction from the B1 field of the RF transmit coil As a next step the patient, with the stereotactic frame and stereotactic locator phantom attached to the patient, is brought to an MR table. The DBS stereotactic frame and locator phantom are placed inside a Transmit/Receive quadrature head coil and a 3D MR image is obtained that include the fiducials on the frame locator phantom. An example of a suitable head coil is commercially available from Siemens, which can be used with Medtronic's MR compatible DBS leads for 1.5 T systems only. This image is utilized by the navigation software to guide the MER (Micro electro-recordings) to the required location accurately. However, there is a drawback on this procedure. The entire DBS operation relies on the images that were obtained before the operation started. The required accuracy of placing the electrodes at the required location is within few millimetres, or the entire procedure will be unsuccessful. The issue exists, during the intra-operative stage, when a burr-hole is opened on the skull and the brain shifts by few millimetres. At that stage, using the presently available coil configuration it is impossible to place back the locator phantom on the stereotactic frame. Thus it is not possible to obtain new set of 3D MRI images to be used as a new registration platform for the navigation software. For this reason it is not possible to capture the changes in the brain movement post burr-hole and accurately guide the MER to the required location and furthermore the accurate placement of the electrodes.

Typically in imaging the patient with the DBS leads in place, the power output of the transmit coil must be limited to less than 0.1 Watts/kg utilizing the existing available head coil described above, in view of the presence of the metal of the DBS leads within the RF field and located in the brain which can cause unacceptable heating of the leads. Due to the restriction of the power that is allowed to be used when imaging DBS leads, it is impossible to obtain any good image quality at such low power levels. Some users resort to exceeding these limits and in rare instances this has resulted in the heating of the leads harming the patient or causing death.

It will be appreciated that the head coil is large and a long distance away from the head so it requires more power to generate an MRI image with an acceptable SNR .

U.S. Pat. No. 6,969,992 (Vaughan) issued Nov. 29 2005 to University of Minnesota discloses a parallel RF transceiver for an NMR system. An excitation and detection circuit has individually controllable elements for use with a multi-element RF coil. Characteristics of the driving signal, including, for example, the phase, amplitude, frequency and timing, from each element of the circuit are separately controllable using small signals. Negative feedback for the driving signal associated with each coil element is derived from a receiver coupled to that coil element.

U.S. Pat. No. 7,525,313 (Boskamp) issued Apr. 28 2009 to GE discloses a system for a multi-channel MR transmission system including transmitting multiple radio frequency (RF) channels via an RF coil assembly. An RF coil assembly having a number of coil elements is configured to transmit a number of RF channels which is less than the number of coil elements thereof. Some implementations may use signal splitters for some or all of the RF channels to produce driving inputs for each coil element. By using more coil elements than RF channels, various embodiments may exhibit increased power efficiency and improved B1 uniformity.

U.S. Pat. No. 6,982,554 (Kurpad) issued Jan. 3 2006 to GE discloses a system and method for operating transmit or transmit/receive elements in an MR system An array of series resonant transmit elements include individual control of RF current in all elements. The array adjusts scan homogeneity during a scan or prescan phase by adjusting amplitude and phase. The array also selectively excites areas of interest, thus avoiding major power dissipation and avoiding heating in the patient.

The disclosures of the above documents are incorporated herein by reference.

SUMMARY OF THE INVENTION

According to one aspect of the invention there is provided an apparatus for use in a stereotactic operating procedure comprising:

a stereotactic head frame for attachment to a patient's head;

a transmit/receive RF coil array fur use in generating an MR image of a head of a patient;

the coil array being arranged for mounting on the stereotactic head frame;

the coil array comprising a plurality of coil elements each for generating an RF field;

the coil elements being arranged to be mounted at respective positions on the frame so as to be located at positions around the head of the patient;

the coil elements being arranged to cooperate to generate an RF field within the head of the patient for imaging of the head;

at least one of the coil elements being removable from the frame; a control system for generating signals for supply to the individual coil elements to generate the RF field;

the control system being arranged to control the signals to the coil elements so as to generate a required RF field with all the coil elements in place and with one or more the coil elements removed.

Preferably the coil element are modular so that they can be removed or placed back on the head frame as required.

Preferably there are provided MR locator elements arranged to be mounted on the frame, each locator element being formed of a material which is compatible with MR imaging and is visible in an MR image and each includes an array of straight edges for defining predetermined lines in the image at predetermined locations for tuning the MR imaging system.

That is the stereotactic locating elements are arranged to calibrate for any non-linearities and non-uniformities arising from a main magnetic field of the MR system as well as the gradient. That is the stereotactic locating elements are arranged to provide additional information regarding image intensity correction from the B1 field of the RF transmit coil.

Preferably the locator elements are also modular and removable from the frame.

Preferably the coil elements are arranged such that they can be mounted on the frame both with the locator elements in place and with the locator elements removed.

Preferably each coil element is associated with a respective locator element.

Preferably each coil element is mounted on an outer side of a respective locator element.

Preferably each coil element is supplied with a signal from a respective channel and the control system is arranged to adjust the B1 sensitivity for each channel to ensure uniform B1 on the imaging area when one or more coil elements are removed Preferably the control system is arranged to adjust the B1 sensitivity for each channel to minimize power levels and to divert the RF field away from any metal leads at or within the patient's head.

Preferably the coil elements are constructed to be sterilizable when removed.

Preferably the control system is arranged to drive the RF signals to each of the coil elements with a single transmitter using a power splitter and/or a Butler matrix to adjust the phase and magnitude of B1.

Preferably the coil elements form a Transceiver (transmit/receive) array that is connected to a set of RF power amplifiers that directly can drive the coils.

Preferably the coil elements are dome shaped. That is the coil elements have an outer face and are tapered from the outer face toward the frame.

Preferably the frame is generally rectangular with a plurality of side faces and the coil elements are arranged around the head on the frame each on a respective side of the frame.

Preferably each of the coil elements comprises a support member removable from the frame and coil electrical components mounted on the support member.

Preferably the control system comprises a multi-transmit evaluation software where the B1 field for each of the coil elements is evaluated and the total B1 field behavior is evaluated as well as the SAR and the phase and magnitude of the magnetic field B1 can be adjusted for each coil element such that the SAR is minimized and the B1 field is only focused on the area of interest.

Preferably the control system is arranged such that in the case that there is not a direct feed from a set of transmit RF amplifiers, a power splitter or power divider is used Preferably the control system is arranged such that, where not all the coil elements are used, a 50 Ohm terminator is provided on the unused channels.

Preferably the control system is arranged such that, where the number of transmit feeds is not directly proportional with the number of transmit elements on the coil elements, a Butler matrix is utilized to combine two or more channels to one of the coil elements.

Preferably each channel of the transceiver array includes a T/R switch where it can be a transmit and receive channel.

Preferably the Transmit and Receive signal for each coil elements on the transceiver are separated.

Preferably there is provided a stereotactic guide member mounted on the head frame for guiding an insertion into the head of the patient, and a selected one or more of the coil elements is removable to allow the guide member to guide the insertion through that part of the frame from which the coil element is removed.

Preferably the coil elements are removed to accommodate imaging during post bur-hole and intra-operational procedures.

Preferably the guide member is arranged to insert a DBS component having supply leads and wherein the coil elements are removed so as to allow a post operational imaging procedure to determine if the DBS component has been placed accurately.

Preferably during the post operational imaging procedure the transmit evaluation software is used so that SAR that does not exceed 0.1 W/kg.

According to a second aspect of the invention there is provide a method for stereotactically inserting a component into the brain of a patient providing a stereotactic head frame for attachment to a patient's head;

providing a stereotactic guide member mounted on the head frame for guiding an insertion into the head of the patient;

providing a transmit/receive RF coil array fur use in generating an MR image of a head of a patient;

the coil array being arranged for mounting on the stereotactic head frame;

the coil array comprising a plurality of coil elements each for generating an RF field;

the coil elements being arranged to be mounted at respective positions on the frame so as to be located at positions around the head of the patient;

the coil elements being arranged to cooperate to generate an RF field within the head of the patient for imaging of the head;

selecting at least one of the coil elements to be removed from the frame to allow access to the brain by the stereotactic guide member;

with the coil element removed, carrying out an imaging procedure using the coil array;

and generating signals for supply to the individual coil elements to generate the RF field arranged to generate a required RF field with said one or more the coil elements removed.

Preferably the selected coil elements are removed to accommodate imaging during post bur-hole and intra-operational procedures.

Preferably a DBS component having supply leads is inserted and a post operational imaging procedure is carried out to determine if the DBS component has been placed accurately.

Preferably during the post operational imaging procedure the transmit evaluation software is used so that SAR that does not exceed 0.1 W/kg.

In general therefore the arrangement provides a modular multi-transmit head coil that has an integrated MR locator as part of the coil structure is presented. The coil/locator has attached MR/CT compatible fiducials on it to correlated images pre-op, intra-op and post op. The coils patterns is a Transceive (transmit/receive) array that is attached directly to a set of a stereotactic locator frame and is connected to a set of RF power amplifiers that directly can drive the coils.

The features of the invention include:

Multi-transmit Head coil with modular elements that are domed shaped. The Elements are distributed around the head in a cubic fashion that is similar to the stereotactic locator box.

each multi-transmit element consists of two primary components. An electrical one that includes each coil element of the transceiver while at the same structure a part of the fiducial or locator frame for the stereotactic application is part of it.

A multi-transmit evaluation software, like XFDTD or FEA, where the B1 field for each of the Transceive arrays is evaluated and the total B1 field behavior is evaluated as well as the SAR. Then the phase and magnitude of the magnetic field B1 can be adjusted for each element such that the SAR is minimized and the B1 field is only focused on the area of interest.

The modularized design allows all or parts of the coils to be used and connected to the RF amplifiers where allowing parts to be removed to accommodate imaging during post bur-hole and intra-operational procedures.

Also the combination of all or part of the of the transceiver array coils can be utilized post operational procedure to determine if the DBS leads have been placed accurately. At the same time utilizing the transmit evaluation software a choice of Minimum SAR that does not exceed 0.1 W/kg) can be chosen with the appropriate combination of magnitude and phase of the B1 field for each element to ensure that we maintain safe limits for SAR.

Alternative embodiments will include:

In the case that there is not a direct feed from a set of transmit RF amplifiers, a power splitter or power divider can be used. During intra-operative procedures where not all the channels can be used, a 50 Ohm terminator on the unused channels can be considered.

Also if the number of transmit feeds is not directly proportional with the number of transmit elements on the coils, a butler matrix can be utilized to combine two or more channels to one transmitter.

Another option is that each channel of the transceiver array can have one T/R switch where it can be a transmit and receive channel Another option is that, the Transmit and Receive signal for each coil on the transceiver are separated The important features are as follows:

Modularize the coils that can be removed or placed back based on the demand during pre-op, post burr-hole or intra-operative and post lead placement procedure Make the MR/CT localizer phantom as modular and part of the coil.

Adjust the B1 sensitivity for each channel to ensure uniform B1 on the imaging area even if one or more elements are missing Adjust the B1 sensitivity for each channel to minimize SAR levels and strip the E-field away from the DBS leads Construct the coils to be sterilizable.

Drive the coils with a single transmitter using a power splitter and/or a Butler matrix. To adjust the phase and magnitude of B1.

BRIEF DESCRIPTION OF THE DRAWINGS

One embodiment of the invention will now be described in conjunction with the accompanying drawings in which.

In the drawings like characters of reference indicate corresponding parts in the different figures.

DETAILED DESCRIPTION

Figure 1:
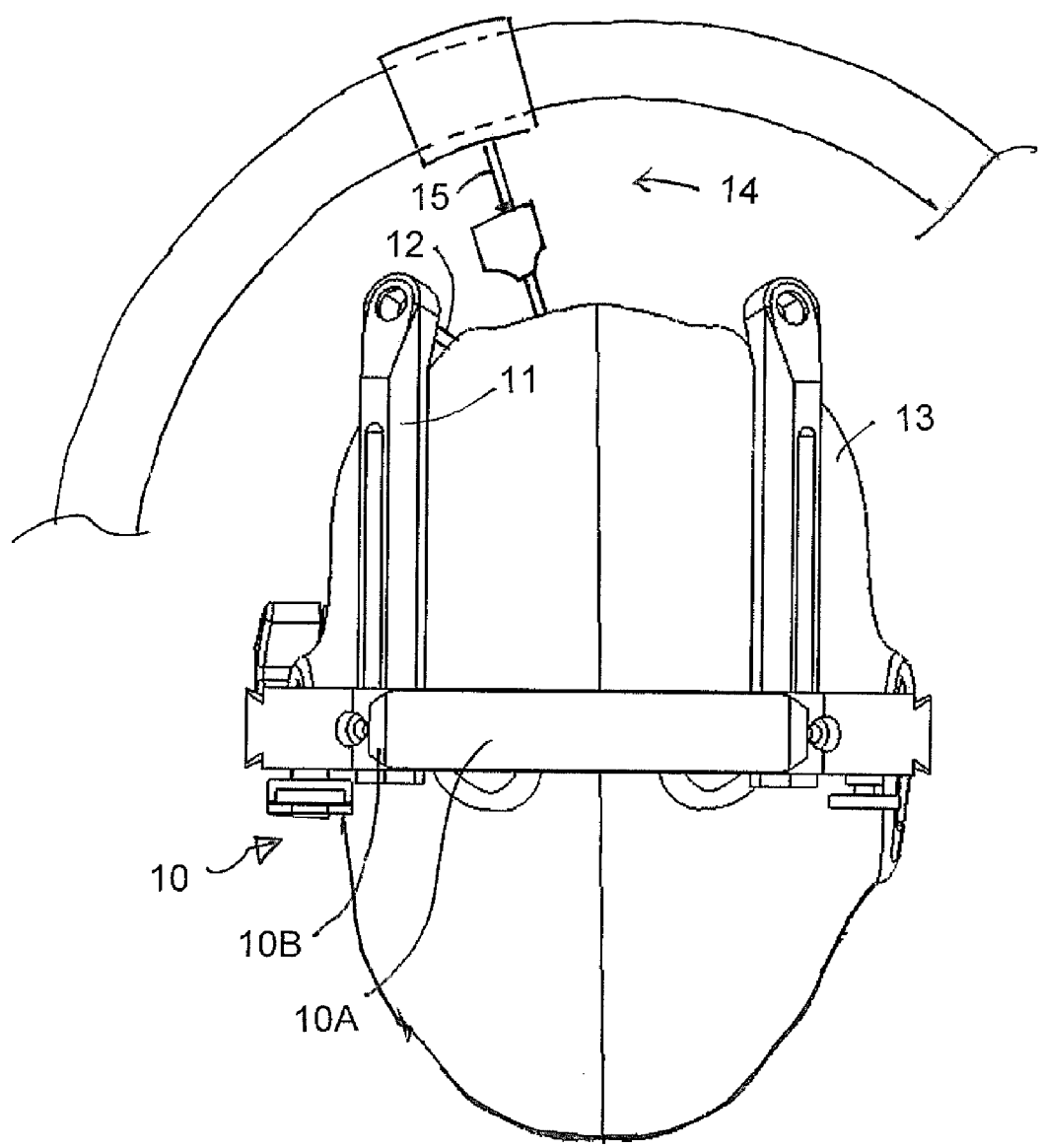
FIG. 1 is an isometric view of an apparatus for use in a stereotactic operating procedure including a stereotactic head frame for attachment to a patient's head and a stereotactic guide device carried on the frame of the type which can be used in the present invention.

An apparatus according to the present invention for use in a stereotactic operating procedure includes a head frame and guide device shown in FIG. 1 of a conventional nature. Such a device can be of the type manufactured by Elekta of Sweden for use with the stereotactically guided radiation knife system sold under the trademark "Gamma Knife". The arrangement shown in FIG. 1 is the Leksell Stereotactic system and includes a stereotactic head frame 10 for attachment to a patient's head. The frame 10 is made up of four sides 10A connected at corners 10B for surrounding the head. The sides connect to clamp elements 11 with clamp pins 12 for engaging and connecting to the skull 13 of the patient. A stereotactic guide member 14 is mounted on the head frame 10 for guiding an insertion of a biopsy needle 15 or other device into the head of the patient. The arrangement shown is well known and widely used for many years so that further description is not required here. It suffice to say that the guide device 14 can be adjusted to required locations around the frame so as to guide the insertion into the required location through a burr hole formed in the skull at the required location.

Figure 2:
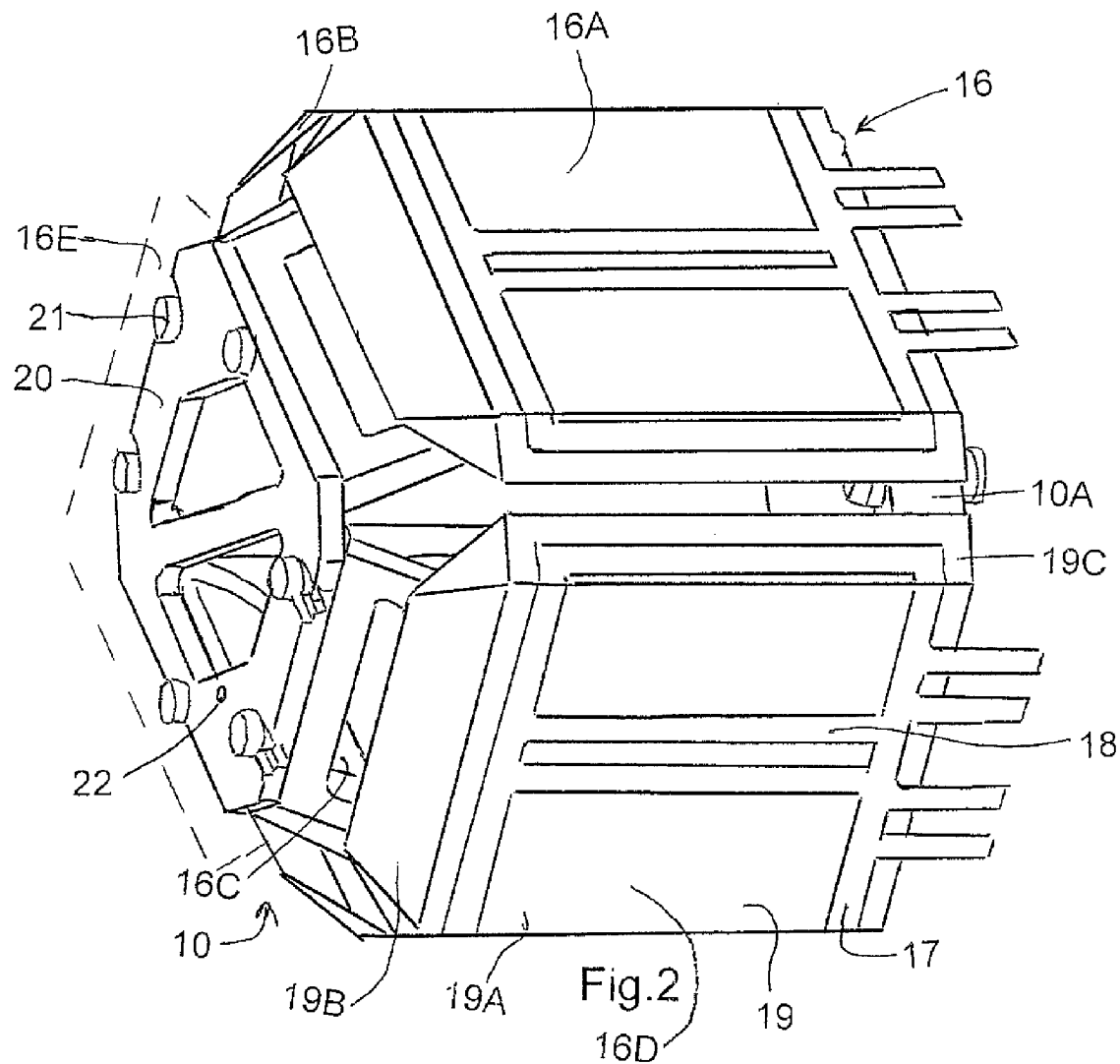
FIG. 2 is a an isometric view of the frame of FIG. 1 on which is mounted the locater elements and coil elements which cooperate with the frame to form the apparatus according to the present invention.
Figure 3:
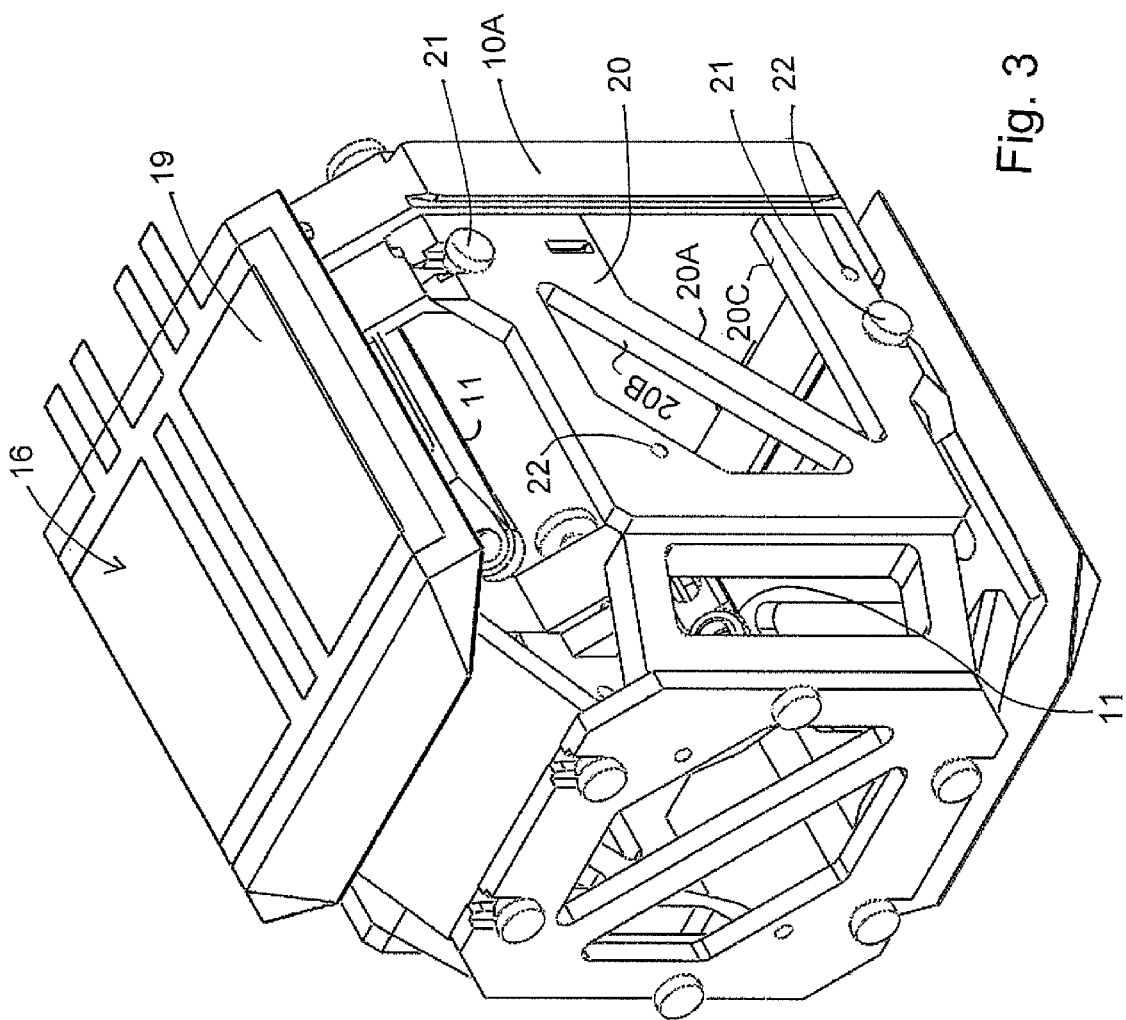
FIG. 3 is an isometric view similar to that of FIG. 2 which some of the coil elements removed to allow access by the stereotactic guide device of FIG. 1.

The frame 10 is also shown in FIGS. 2 and 3 with the sides 10A arranged at right angles to form a generally cubic structure to surround the head of the patient. On the frame is mounted a transmit/receive RF coil array 16 fur use in generating an MR image of a head of a patient. The coil array 16 comprising a plurality of coil elements 16A, 16B, 16C, 16D and 16E each for generating an RF field. The elements 16A to 16D are mounted on the four sides of the frame with the element 16E shown only in phantom on the top or end of the frame.

The coil elements are arranged to be mounted at the respective positions on the frame so as to form a generally rectangular or cubic array at positions around the head of the patient. The coil elements are arranged to cooperate to generate an RF field within the head of the patient for imaging of the head. As shown, each coil element is formed with two loops 17, 18 cooperating on a single mounting base 19. The loops 17, 18 are arranged to cover one side of the frame. The number of loops can be modified depending on the requirements of the designer of the phased loop array to be used on the frame.

As shown in FIG. 3, at least one of the coil elements is removable from the frame, that is in general each of the elements is individually removable with the operator being able to select the elements to be removed in the operation concerned.

Thus in general, the coil elements are mounted at respective positions on the frame so as to be located at positions around the head of the patient. Prior to the operation, generally all of the five coil elements remain in place for the most effective and accurate imaging.

For the stereotactic procedure, at least one of the coil elements is selected to be removed from the frame to allow access to the brain by the stereotactic guide member. The other coil elements remain in place for further imaging to be carried out. With the coil element removed, therefore an imaging procedure using the coil array is carried out.

The control system for generating the RF signals is arranged for generating signals for supply to the individual coil elements to generate the RF field required for the imaging and is arranged to generate a required RF field with the coils all in place and with one or more the coil elements removed. Thus the selected coil elements are removed to accommodate imaging during post burr-hole and intra-operational procedures.

The arrangement described herein is particularly effective for the DBS procedures previously described where imaging after formation of the burr hole is desirable to determine any brain shift. Also imaging after insertion of the DBS device is desirable to ensure the accurate location of the device taking into account any further movement or inaccuracy in the insertion.

Thus in use the DBS device is inserted using the stereotactic guide member 14 mounted on the head frame for guiding the insertion into the head of the patient. In order to do this, a selected one or more of the coil elements is removed to allow the guide member to guide the insertion through that part of the frame from which the coil element is removed. That is the coil elements are removed to accommodate imaging during post bur-hole and intra-operational procedures.

In order to prevent excess heating of the DBS leads during the post operational imaging procedure, the transmit evaluation software 70 (FIG. 4) is used so that SAR that does not exceed 0.1 W/kg. Also the field is controlled to limit the transmission of the RF field to the area of the DBS leads.

Each coil element has the base thereof formed as a rectangular panel covering the respective side. The coil elements are modular so that they can be removed or placed back on the head frame as required.

There is also provided on the frame 10 a plurality of MR locator elements 20 arranged to be mounted on the frame. Thus each side of the frame has a respective locator element formed as a flat panel to be attached to the frame underneath the respective one of the coil elements 16. Each locator element 20 is formed of a material which is compatible with MR imaging and is visible in an MR image. Each includes an array of straight edges 20A, 20B, 20C for defining predetermined lines in the image at predetermined locations. These lines in the image are observed to see whether they are properly straight and properly located since any distortion will show up in the image allowing tuning of the MR imaging system. That is the stereotactic locating elements are arranged to calibrate for any non-linearities and non-uniformities arising from a main magnetic field of the MR system as well as the gradient. That is the stereotactic Locating elements are arranged to provide additional information regarding image intensity correction from the B1 field of the RF transmit coil. The operation of such locator elements, otherwise known as a locator box or locator phantom, is known to persons skilled in this art.

The locator elements are modular and removable from the frame. The locator elements 20 are mounted on pins 21 carried on the frame. The coil elements are arranged such that they can be mounted on the frame both with the locator elements in place and with the locator elements removed. That is the coil elements can mount on holes 22 of the locator elements by studs on the coil elements on an outer side of a respective locator element or the coil elements can be mounted directly on the pins 21 by suitable receptacles so that the coil elements can be used with or without the locator elements. The mounting arrangements shown are only examples of suitable mechanical connections. When connected to its respective locator element, each coil element is associated with a respective locator element. The coil elements and the locator elements are constructed of suitable materials to be sterilizable when removed. The coil elements are dome shaped, that is, the base 19 of each of the coil elements has an outer face 19A and is tapered at the side edges 19B and 19C from the outer face toward the frame. This construction brings the conductors of the coil as close as possible to the locator element inside the coil element.

Figure 5:
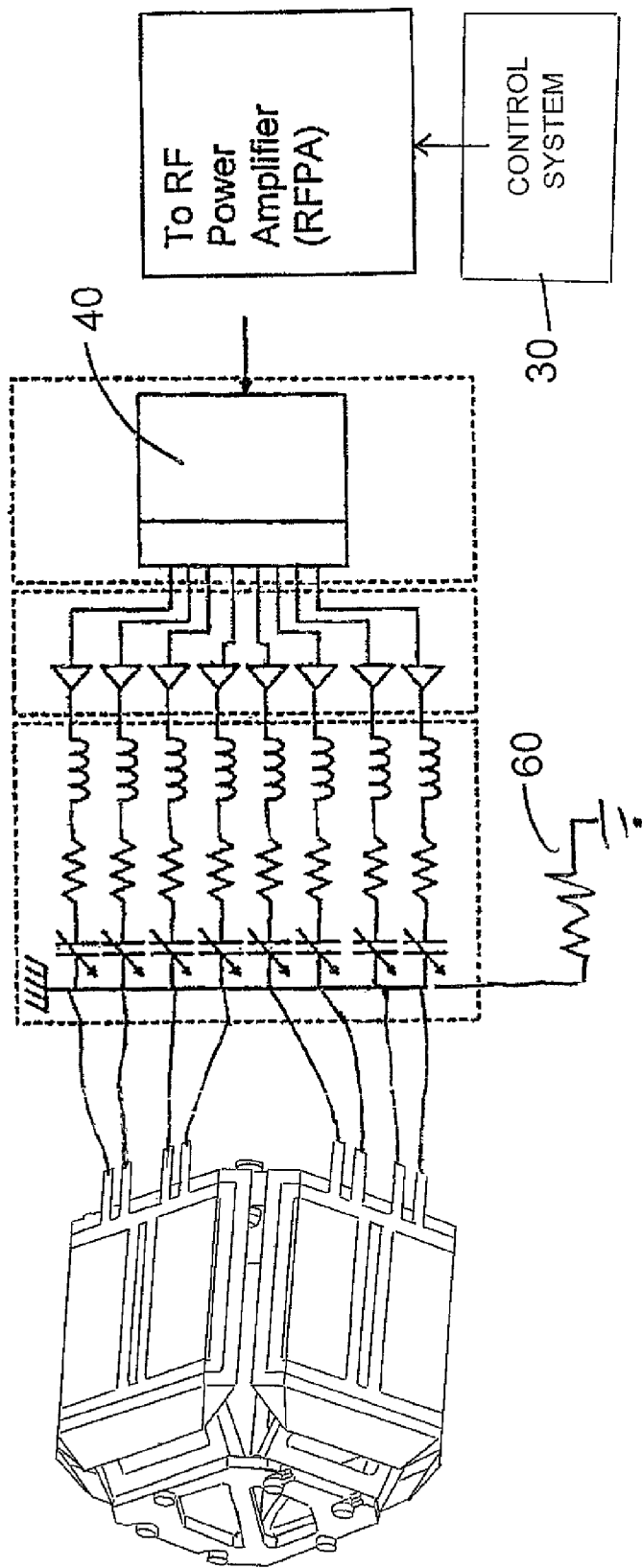
FIG. 5 is a schematic illustration of an 8 channel transmit system for the apparatus of FIG. 1 attached to a single RFPA (power amplifier) and utilizing a power divider for distributing the power to all channels.

The MR control system 30 shown in FIG. 5 is of a conventional construction well known to persons skilled in the art and acts for controlling the imaging system and generating the necessary RF signals to supply to the RF coil elements. The control system is arranged to control the RF signals to the coil elements so as to generate a required RF field with all the coil elements in place and with one or more the coil elements removed.

The control system includes a multi-transmit evaluation software where the B1 field for each of the coil elements is evaluated and the total B1 field behavior is evaluated as well as the SAR and the phase and magnitude of the magnetic field B1 can be adjusted for each coil element such that the SAR is minimized and the B1 field is only focused on the area of interest.

Each coil element is supplied with a signal from a respective channel and the control system is arranged to adjust the B1 sensitivity for each channel to ensure uniform B1 on the imaging area when one or more coil elements are removed.

The control system is arranged to adjust the B1 sensitivity for each channel to minimize power levels and to divert the RF field away from any metal leads at or within the patient's head.

The control system as shown in FIG. 5 is arranged to drive the RF signals to each of the coil elements with a single transmitter using a power splitter 40 and/or a Butler matrix to adjust the phase and magnitude of B1.

Figure 4:
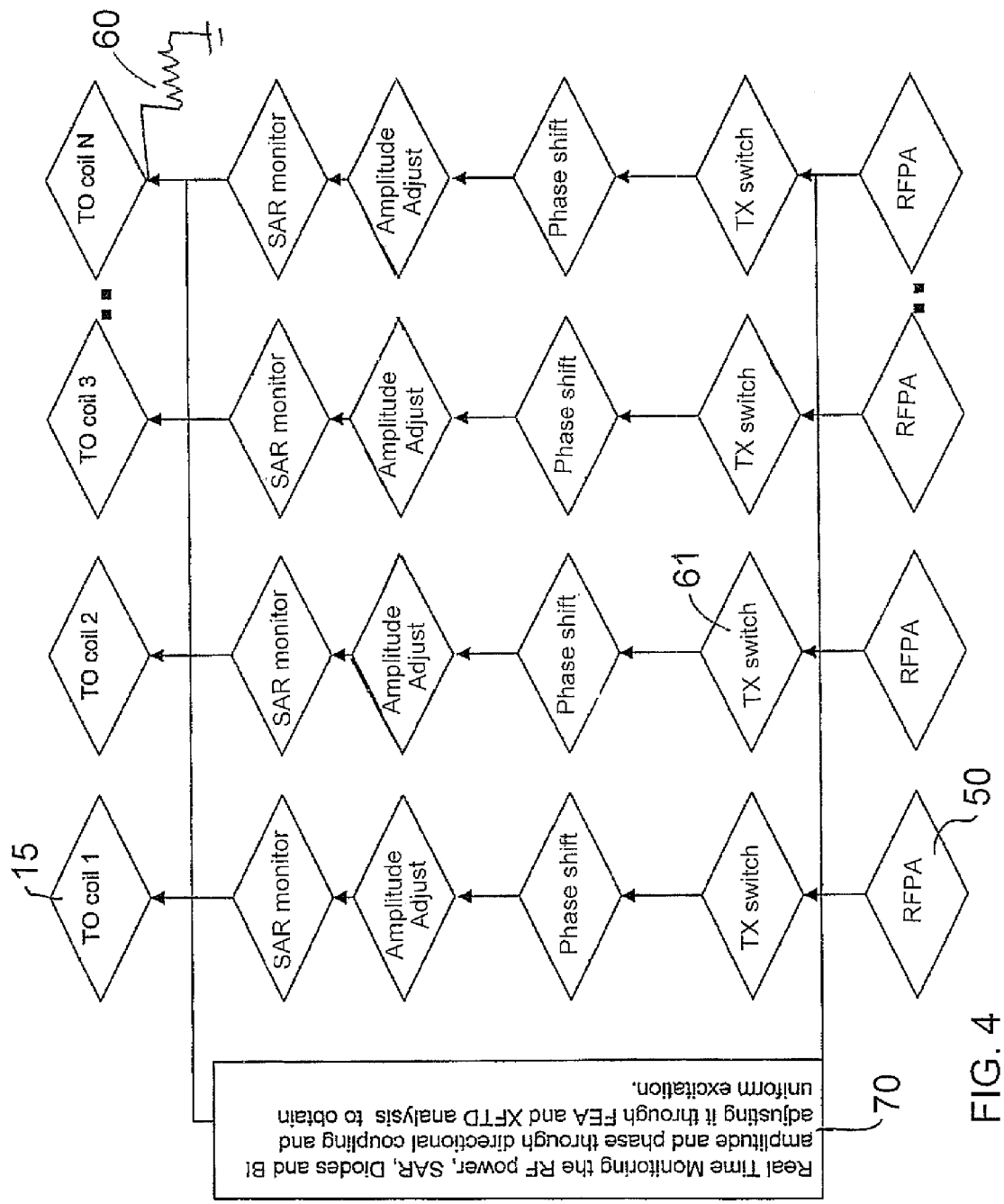
FIG. 4 is a schematic diagram of the control system including separate control of each channel of the array.
Figure 6:
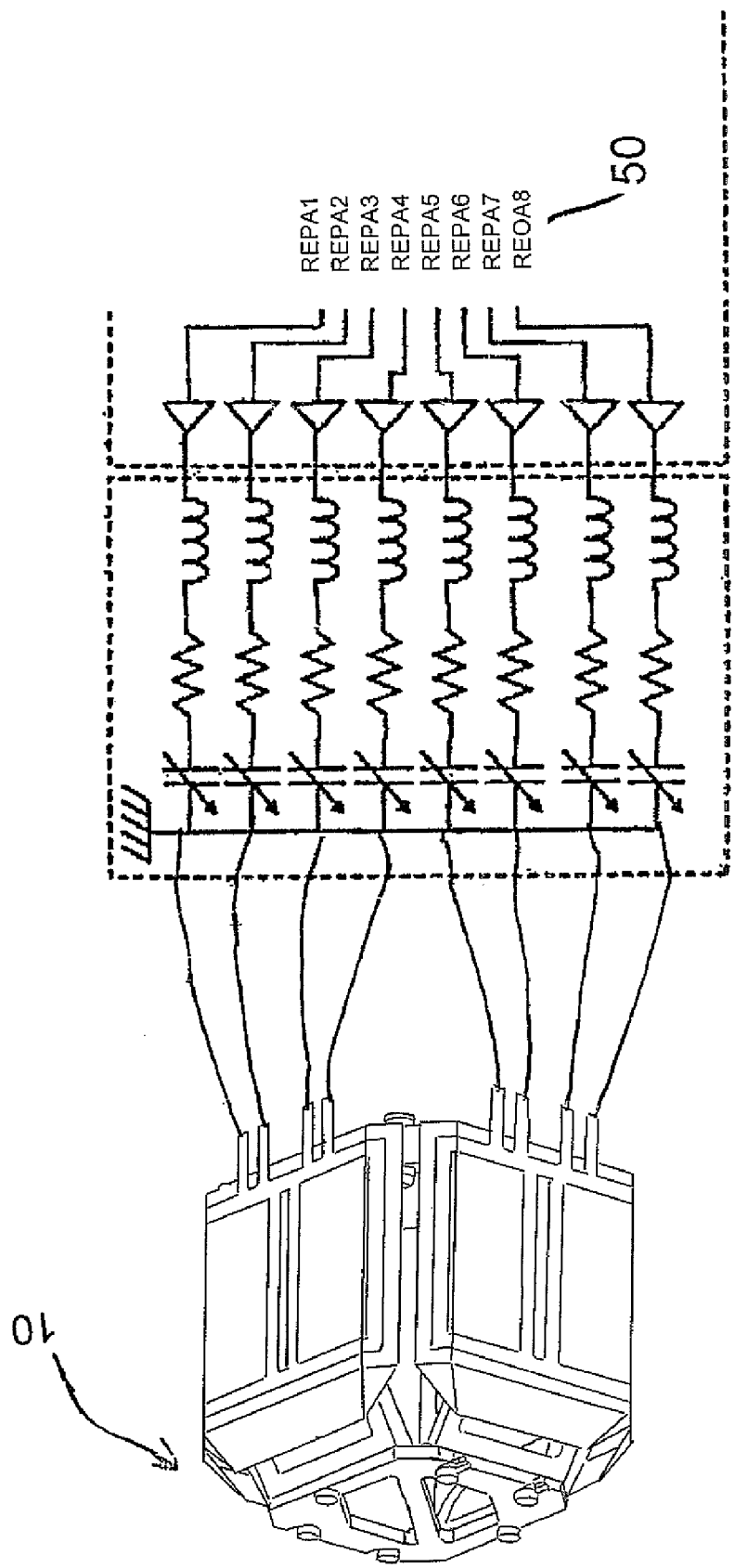
FIG. 6 is a schematic illustration of an 8 channel transmit system for the apparatus of FIG. 1 attached to 8 RFPAs for distributing the power to all channels.

Alternatively as shown in FIGS. 4 and 6, the coil elements form a Transceiver (transmit/receive) array that is connected to a set of RF power amplifiers 50 that directly can drive the coils.

Thus the control system is arranged such that, in the case that there is not a direct feed from a set of transmit RF amplifiers, a power splitter or power divider is used. The control system is arranged such that, where not all the coil elements are used, that is one or more is removed as set forth above, a 50 Ohm terminator 60 (FIG. 6) is provided on the unused channels.

The control system is arranged such that, where the number of transmit feeds is not directly proportional with the number of transmit elements on the coil elements, a Butler matrix is utilized to combine two or more channels to one of the coil elements.

As shown in FIG. 4 each channel of the transceiver array includes a T/R switch 61 where it can be a transmit and receive channel.

The Transmit and Receive signal for each coil elements on the transceiver are separated.

Since various modifications can be made in my invention as herein above described, and many apparently widely different embodiments of same made within the spirit and scope of the claims without department from such spirit and scope, it is intended that all matter contained in the accompanying specification shall be interpreted as illustrative only and not in a limiting sense.

The invention claimed is:

1. A method for stereotactically inserting a component into the brain of a patient
   attaching a stereotactic head frame to a patient's head;
   providing a stereotactic guide member mounted on the head frame for guiding an insertion into the head of the patient;
   providing a transmit/receive RF coil array for use in generating an MR image of a head of a patient;
   the coil array being mounted on the stereotactic head frame at respective positions on the frame so as to be located at positions around the head of the patient;
   the coil array comprising a plurality of coil elements each for generating an RF field;
   generating signals for supply to the individual coil elements to cooperate to generate a predetermined required RF field within the head of the patient for imaging of the head;
   with the coil array in place on the stereotactic head frame, using the predetermined required RF field to carry out a first imaging procedure of the head of the patient in an MR imaging system;
   selecting at least one of the coil elements to be removed from the frame to allow access to the brain by the stereotactic guide member;
   removing said at least one of the coil elements;
   generating signals for supply to the individual coil elements to generate the predetermined required RF field with said one or more the coil elements removed;
   and with the coil array in place on the stereotactic head frame, using the predetermined required RF field to carry out a second imaging procedure of the head of the patient in the MR imaging system.

2. The method according to claim 1 wherein the stereotactic procedure is the insertion of a Deep Brain Stimulation (DBS) component having supply leads and the second imaging procedure is a post operational imaging procedure carried out to determine if the DBS component has been placed accurately.

3. The method according to claim 1 wherein during the second imaging procedure a transmit evaluation software is used so that Specific Absorption Rate (SAR) does not exceed 0.1W/kg.

4. The method according to claim 1 wherein a multi-transmit evaluation software is used to evaluate the field for each of the coil elements and the required field generated thereby as well as the SAR and wherein the phase and magnitude of the magnetic field of each coil element is adjusted for each coil element such that the SAR is minimized and the required field generated thereby is only focused on the area of interest.

5. The method according to claim 1 wherein the signals for the coil elements are generated by a plurality of channels and wherein each coil element is supplied with a signal from a respective channel and the sensitivity for each channel is adjusted to ensure uniform field on the imaging area.

6. The method according to claim 5 wherein the sensitivity for each channel is adjusted to minimize power levels and to divert the RF field away from any metal leads at or within the patient's head.

7. The method according to claim 6 herein the coil elements are modular so as to be removed and placed black on the head frame as required.

8. The method according to claim 7 wherein the locator elements are modular and removable from the frame.

9. The method according to claim 5 including MR locator elements mounted on the frame, each locator element being formed of a material which is compatible with MR imaging and is visible in an MR image and each locator element includes an array of straight edges for defining predetermined line in the image at predetermined locations for tuning the MR imaging system.

10. The method according to claim 9 wherein the coil elements are arranged such that they can be mounted on the frame both with the locator elements in place and with the locator elements removed.

11. The method according to claim 9 wherein each coil element is associated with a respective locator element.

12. The method according to claim 9 wherein each coil element is mounted on an outer side of a respective locator element.

13. The method according to claim 5 wherein the signals to each of the coil elements are driven with a single transmitter using a power splitter and/or a Butler matrix to adjust the phase and magnitude.

14. The method according to claim 13 wherein the Butler matrix is utilized to combine two or more channels of the power splitter to one of the coil elements.

15. The method according to claim 5 wherein the coil elements form a Transceiver (transmit/receive) array that is connected to a set of RF power amplifiers that directly can drive the coils.

16. The method according to claim 5 wherein the coil elements are provided with an outer face which is tapered from the outer face toward the frame.

17. The method according to claim 5 wherein the frame is shaped so as to be generally rectangular with a plurality of side faces and the coil elements are arranged around the head on the frame each on a respective side of the frame.

18. The method according to claim 5 wherein when said at least one coil element is removed, a 50 Ohm terminator is provided.

19. The method according to claim 5 wherein each of the coil elements is associated with a Transmit/Receive switch where it can form a transmit and receive channel.

20. The method according to claim 19 wherein the transmit and receive signals for each of the coil elements are separated.

\* \* \* \* \*